(12) United States Patent
Sundareswaran et al.

(10) Patent No.: US 9,264,040 B2
(45) Date of Patent: Feb. 16, 2016

(54) LOW LEAKAGE CMOS CELL WITH LOW VOLTAGE SWING

(71) Applicant: FREESCALE SEMICONDUCTOR, INC., Austin, TX (US)

(72) Inventors: Savithri Sundareswaran, Austin, TX (US); Alexander B. Hoefler, Austin, TX (US); Benjamin S. Huang, Austin, TX (US); Anis M. Jarrar, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 117 days.

(21) Appl. No.: 14/134,082

(22) Filed: Dec. 19, 2013

(65) Prior Publication Data
US 2015/0180452 A1    Jun. 25, 2015

(51) Int. Cl.
H03K 17/14       (2006.01)
H03K 19/00       (2006.01)

(52) U.S. Cl.
CPC ................................. *H03K 19/0013* (2013.01)

(58) Field of Classification Search
USPC .......... 327/530, 534–535, 537; 257/357, 371, 257/401
See application file for complete search history.

(56) References Cited

U.S. PATENT DOCUMENTS

| | | | |
|---|---|---|---|
| 5,243,228 A * | 9/1993 | Maruyama et al. | 327/534 |
| 5,740,102 A * | 4/1998 | Kawashima | 365/154 |
| 5,850,157 A | 12/1998 | Zhu et al. | |
| 6,097,113 A * | 8/2000 | Teraoka et al. | 307/125 |
| 7,276,956 B2 * | 10/2007 | Furuta et al. | 327/534 |
| 7,541,647 B2 * | 6/2009 | Shibata et al. | 257/357 |
| 8,471,618 B2 | 6/2013 | Chien et al. | |
| 2008/0174359 A1 * | 7/2008 | Osada et al. | 327/534 |

OTHER PUBLICATIONS

Kawaguchi, Hiroshi et al. "A Reduced Clock-Swing Flip-Flop (RCSFF) for 63% Power Reduction." IEEE Journal of Solid-State Circuits, vol. 33, No. 5, May 1998 pp. 807-811.

* cited by examiner

*Primary Examiner* — An Luu
(74) *Attorney, Agent, or Firm* — Gary Stanford; Huffman Law Group, PC

(57) ABSTRACT

A CMOS cell incorporated on an integrated circuit including a PMOS transistor and an NMOS transistor. The current terminals of the PMOS and NMOS transistors are coupled in series between a lower voltage supply rail and a reference rail. The well connection of the PMOS transistor is coupled to an upper voltage supply rail having a voltage level greater than the lower voltage supply rail. The CMOS cell has low voltage swing and low leakage current to reduce power consumption. A second PMOS and NMOS transistor pair may be included and coupled in similar manner and to the first PMOS and NMOS pair to form a non-inverting cell. The PMOS transistors may be implemented in an N-well that is conductively tied to the upper supply voltage rail to avoid isolation barriers. The cell may be used in a clock tree to significantly reduce power consumption of the integrated circuit.

17 Claims, 4 Drawing Sheets

LOW LEAKAGE CMOS CELL WITH LOW VOLTAGE SWING

BACKGROUND OF THE INVENTION

1. Field of the Invention

The present disclosure relates generally to reduced power consumption, and more specifically to a low leakage CMOS cell with low voltage swing for reduced power consumption and having a reduced footprint.

2. Description of the Related Art

As integrated circuit (IC) design and fabrication techniques continue to advance, operating voltages and device sizes have each scaled downward. Complementary Metal-Oxide Semiconductor (CMOS) circuitry dissipates less power and is more dense than other types of integrated circuit (IC) technologies so that CMOS technology has become the dominant style of digital circuit design for integrated circuits. CMOS circuits typically use a combination of N-channel (NMOS) and P-channel (PMOS) devices (e.g., transistors) each having a threshold gate-to-source voltage based on design, scale, materials and process. As device sizes and voltage levels have decreased, the channel lengths and oxide thicknesses of each device have also decreased. Sub-threshold leakage current is the current that flows between the drain and source when the gate-to-source voltage is below the threshold voltage of the CMOS device. In such conventional configurations the sub-threshold leakage current may account for a significant amount of total power consumption of the IC especially at higher temperatures. Leakage current may consume a significant amount of power even when the IC is otherwise idle.

Many IC designs incorporate a significant number of CMOS cells (e.g., configured as buffers, inverters, gating devices, flip-flops, etc.) for performing a variety of functions, including a few non-limiting examples such as signal distribution, signal processing, maintaining digital signal integrity, etc. As used herein, the term "cell" is defined as any CMOS circuit incorporating any combination of PMOS and NMOS transistors for performing any suitable function, such as buffers, inverters, flip-flops, etc. Clock distribution involves a significant portion of the total circuitry and total number of transistors. Reducing the power consumption of the clock distribution network, therefore, is advantageous in reducing overall power. Buffer cells are often used for clock signal distribution within one or more clock trees. Low-swing clock tree design is a method used to reduce power in the clock tree. One method to achieve low-swing is to use a single lower voltage level in the IC design. In this method, a combination of transistors and/or other circuitry is used to shift the output swing to a lower voltage level due to inherent threshold voltage of the transistors. This method tends to substantially increase overhead cost in terms of additional design effort and increased area consumption.

Another method to achieve low-swing of signals, including clock signals, is to create a separate lower voltage level. The conventional approach to this method is to provide transistors operating in a lower voltage domain. The transistors operating in the lower voltage domain must be separated, however, from those operating in the higher voltage domain using well isolation. Well isolation means separating the semiconductor wells of low voltage cells from those of higher voltage cells by a sufficient isolation distance. During chip design, such well isolation creates issues in terms of well continuity and placement of well ties for the different voltage domains. Such well isolation, for example, consumes valuable area of the IC to isolate the different voltage domains. Layout design effort is substantially increased in an attempt to ensure proper isolation between the separate voltage domains while minimizing the area consumption of isolation barriers.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present inventors have recognized that low leakage cells with low voltage swing is advantageous in reducing power consumption of an IC. The present inventors have therefore developed a low leakage CMOS cell with low voltage swing without the need for well isolation to reduce cell footprint. Low swing and low leakage cells as described herein avoid isolation barriers thereby avoiding additional layout design effort and providing more substrate space for functional cell placement. Low swing and low leakage cells as described herein may be used as clock distribution buffers (or buffer cells) to substantially reduce total power consumption of the IC.

Figure 1:
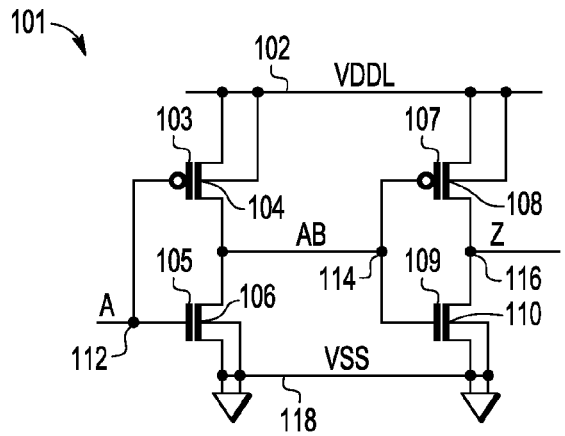
FIG. 1 is a schematic diagram of a conventional buffer cell.

FIG. 1 is a schematic diagram of a conventional buffer cell 101. The buffer cell 101 includes a pair of PMOS transistors 103 and 107 and a corresponding pair of NMOS transistors 105 and 109 according to a CMOS configuration. The source terminals of the PMOS transistors 103 and 107 are coupled to a lower voltage rail 102 developing a lower supply voltage VDDL relative to a nominal supply voltage level VDD. Both supply voltages VDD and VDDL are referenced to a reference voltage level VSS developed on a reference voltage rail 118, in which VSS has any suitable positive, negative or ground reference voltage level. The gate terminal of PMOS transistor 103 is coupled to the gate terminal of NMOS transistor 105 at an input node 112 receiving an input signal A. The drain terminal of PMOS transistor 103 is coupled to the drain terminal of NMOS transistor 105 at an intermediate node 114 developing a signal AB.

The gate terminal of PMOS transistor 107 is coupled to the gate terminal of NMOS transistor 109 at the intermediate node 114. The drain terminal of PMOS transistor 107 is coupled to the drain terminal of NMOS transistor 109 at an output node 116 developing an output signal Z. The sources of the NMOS transistors 105 and 109 are coupled to VSS at the reference voltage rail 118. The PMOS transistors 103 and 107 have well connections 104 and 108, respectively, which are tied to the lower voltage rail 102 (VDDL). Similarly, the NMOS transistors 105 and 109 have substrate (or bulk) connections 106 and 110, respectively, which are tied to the reference voltage rail 118 (VSS).

In operation of the buffer cell 101, when input signal A is low, the PMOS transistor 103 is turned on while the NMOS transistor 105 is turned off so that signal AB is pulled to the voltage level of VDDL. Thus, the transistors 103 and 105 form a first inverting stage of the buffer cell 101. When AB is high, NMOS transistor 109 is turned on and PMOS transistor 107 is turned off so that the output signal Z is pulled low to VSS. Thus, the transistors 107 and 109 form a second inverting stage of the buffer cell 101. The state of output signal Z follows the state of the input signal A after the delays through the buffer stages. Since the transistors of the buffer cell 101 are coupled between the lower voltage rail 102 and the reference voltage rail 118, the signals AB and Z are low-swing signals ranging between VDDL and VSS to reduce power consumption. Although power consumption is reduced because of low-swing, power consumption is not minimized since the buffer cell 101 still has significant leakage current. Furthermore, the transistors of the buffer cell 101 require isolation which consumes valuable area of the IC and substantially increases layout design effort as further described herein with reference to FIG. 2.

Figure 2:
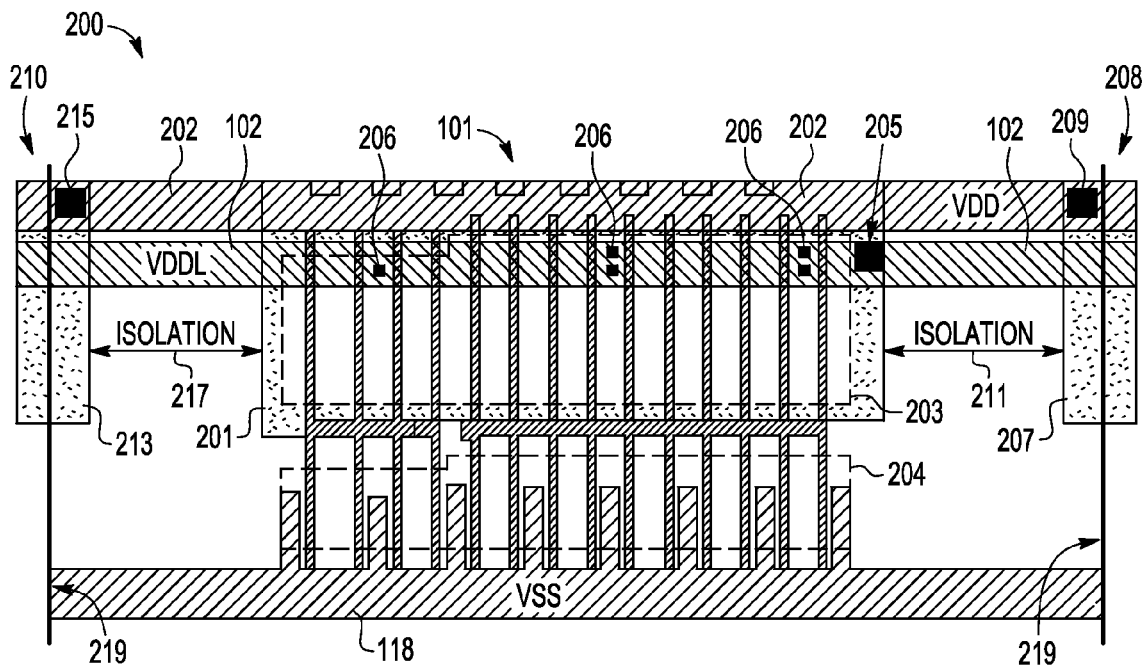
FIG. 2 is a simplified diagram depicting a conventional physical substrate configuration for physically implementing the buffer cell of FIG. 1.

FIG. 2 is a simplified diagram depicting a conventional physical substrate configuration for physically implementing the buffer cell 101 on an IC 200. The lower voltage rail 102 is implemented as a conductive rail biased with the lower supply voltage VDDL. Another conductive rail forms an upper voltage rail 202 biased with the nominal supply voltage level VDD. An N-well 201 is formed on the substrate for implementing multiple PMOS devices shown generally formed within an area 203, which includes the PMOS transistors 103 and 107. A conductive connection 205 is formed to electrically connect the N-well 201 to the lower voltage rail 102 for operation at the lower supply voltage level VDDL. Connections 206 generally show connections of the source terminals of PMOS transistors 103 and 107 to the lower supply voltage level VDDL. The reference voltage rail 118 is implemented as another conductive rail at the reference voltage level. The NMOS transistors 105 and 109 are generally formed within an area 204 with source terminals and substrate connections coupled to the reference voltage rail 118, but are not further described.

The IC 200 includes higher voltage level cells 208 and 210 formed on either side of the buffer cell 101 that operate at the nominal supply voltage level VDD, in which the cells 208 and 210 are separated from the buffer cell 101 by isolation barriers 211 and 217, respectively. As shown, the IC 200 includes another N-well 207, and a conductive connection 209 is formed to electrically connect the N-well 207 to the upper voltage rail 202 for operation at the upper supply voltage level VDD for the cell 208 (partially shown on the right). The N-wells 201 and 207, therefore, are in separate voltage domains since operating at different voltage levels. N-well 201 is in a lower voltage domain associated with VDDL, whereas N-well 207 is in a higher voltage domain associated with VDD. The N-wells 201 and 207, therefore, are physically separated by the isolation barrier 211 to ensure electrical integrity and proper operation of both voltage domains. In a similar manner, the IC 200 includes another N-well 213, and a conductive connection 215 is formed to electrically connect the N-well 213 to the upper voltage rail 202 for operation at the upper supply voltage level VDD for the cell 210 (partially shown on the left). The N-well 213 is also in the higher voltage domain, and is physically separated by the isolation barrier 217 to ensure electrical integrity and proper operation of both voltage domains.

The isolation barriers 211 and 217 consume valuable substrate area of the IC 200 to separate the different voltage domains between the buffer cell 101 and the adjacent cells 208 and 210. The isolation barriers 211 and 217 thus cause a substantial area penalty that results in a significant reduction of usable space. The cell 101 itself along with the isolation barriers 211 and 217 increase the size of the overall cell boundary 219. The space penalty of isolation barriers can result in a reduction of usable space by a factor of 2 or 3 or more with a significant number of devices in the lower voltage domain. A clock distribution system may represent 5%-10% of the total circuitry and/or number of transistors, and if implemented in the lower voltage domain, results in a substantial area penalty on the IC 200. Furthermore, additional layout design effort is necessary to separate the different voltage domains with sufficient isolation barriers across the chip.

Figure 3:
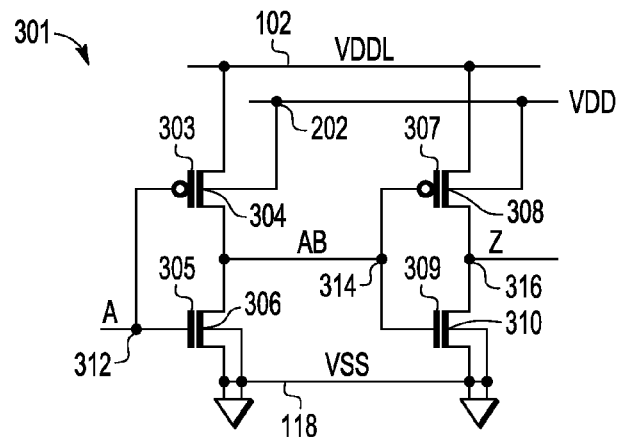
FIG. 3 is a schematic diagram of a low leakage buffer cell with low voltage swing according to one embodiment.

FIG. 3 is a schematic diagram of a low leakage buffer cell 301 with low voltage swing according to one embodiment. The buffer cell 301 includes a pair of PMOS transistors 303 and 307 and a corresponding pair of NMOS transistors 305 and 309 according to a CMOS configuration. The source terminals of the PMOS transistors 303 and 307 are coupled to the lower voltage rail 102 (VDDL) in similar manner as the buffer cell 101. The gate terminal of PMOS transistor 303 is coupled to the gate terminal of NMOS transistor 305 at an input node 312 receiving a similar input signal A. The drain terminal of PMOS transistor 303 is coupled to the drain terminal of NMOS transistor 305 at an intermediate node 314 developing a signal AB.

The gate terminal of PMOS transistor 307 is coupled to the gate terminal of NMOS transistor 309 at the intermediate node 314. The drain terminal of PMOS transistor 307 is coupled to the drain terminal of NMOS transistor 309 at an output node 316 developing an output signal Z. The sources of the NMOS transistors 305 and 309 are coupled to VSS at the reference voltage rail 118.

In contrast to the buffer cell 101, the PMOS transistors 303 and 307 have well connections 304 and 308, respectively, which are tied to the upper voltage rail 202 (VDD) rather than to the lower voltage rail 102. The NMOS transistors 305 and 309 have substrate connections 306 and 310, respectively, which are tied to the reference voltage rail 118 (VSS). By tying the PMOS well connections to a voltage (VDD) higher than its source terminal connections (at VDDL), the PMOS transistors have an effective increase in threshold voltage. This helps in reducing leakage of the PMOS transistors and leakage current of the buffer cell 301.

Operation of the buffer cell 301 is substantially similar to that of the buffer cell 101. The transistors 303 and 305 form a first inverting stage and the transistors 307 and 309 form a second inverting stage of the buffer cell 301. Signal AB is an inverted version of A, and Z is an inverted version of AB, so that the state of the output Z generally follows the state of the input after delays through the buffer cell 301. Since the transistors of the buffer cell 301 are coupled between the lower voltage rail 102 and the reference voltage rail 118 in similar manner as the buffer cell 101, the signals AB and Z are low-swing signals between VDDL and VSS to reduce power consumption.

Power consumption is not only reduced because of low voltage swing of the signals, power consumption is further reduced because leakage current is also reduced. The well connections 304 and 308 of the PMOS transistors 303 and 307 are pulled to the higher voltage level VDD to reduce leakage current of the PMOS transistors.

Figure 4:
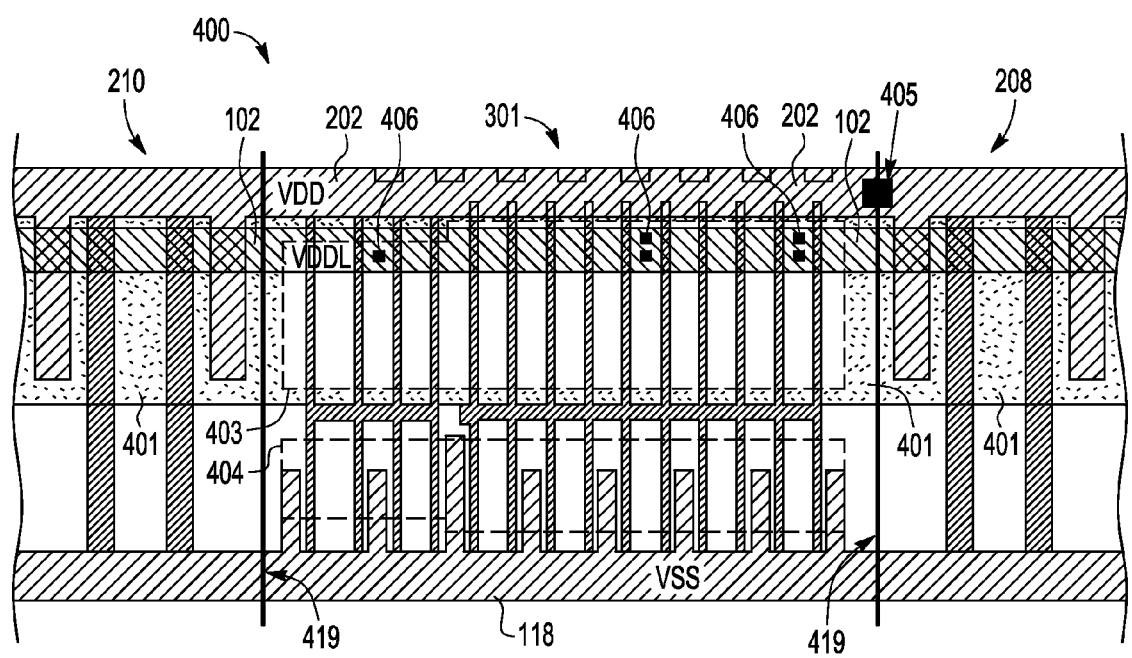
FIG. 4 is a simplified diagram depicting a physical substrate configuration for physically implementing the buffer of FIG. 3.

FIG. 4 is a simplified diagram depicting a physical substrate configuration for physically implementing the buffer cell 301 on an IC 400. The lower voltage rail 102 is implemented as the conductive rail charged with the lower supply voltage VDDL and another conductive rail forms the upper voltage rail 202 charged with the nominal supply voltage level VDD. An N-well 401 is formed on the substrate for implementing PMOS devices within the buffer cell 301. In this case, however, rather than providing separate and isolated N-wells for the adjacent cells 208 and 210, the same N-well 401 that is formed for the buffer cell 301 may be extended into the adjacent cells 208 and 210 without isolation barriers. The PMOS transistors 303 and 307 of the buffer cell 301 are formed within an area shown generally at 403. The NMOS transistors 305 and 309 are formed within an area 404 with source terminals coupled to the reference voltage rail 118, but are not further described. A conductive connection 405 is formed to electrically connect the N-well 401 to the upper voltage rail 202 for the buffer cell 301 and for the adjacent cells 208 and 210. Additional conductive connections between the N-well 401 and the upper voltage rail 202 may be included if desired. The source terminals of the PMOS transistors 303 and 307 are coupled to the lower voltage rail 102 as shown by connections 406 (similar to the connections 206) for operation at the lower supply voltage level VDDL. The N-well 401, however, is tied to VDD rather than to VDDL.

The higher voltage level cells 208 and 210 that operate at the nominal supply voltage level VDD of the IC 400 are formed on either side of the buffer cell 301. The N-wells of surrounding cells that are also connected to VDD do not need to be isolated from the N-well of the buffer cell 301. As shown, the devices (e.g., PMOS transistors) of the adjacent cells 208 and 210 may be formed within the same N-well 401 of the buffer cell 301. In this manner, the isolation barriers 211 and 217, which were necessary for the physical configuration of the PMOS transistors 103 and 107 of the buffer cell 101, are not necessary for the PMOS transistors 303 and 307 of the buffer cell 301. The cell area defined by the cell boundary 419 of cell for the PMOS devices is significantly smaller than the cell area defined by the boundary 219 since the isolation barriers 211 and 217 are avoided. In this manner, the area penalty of the conventional low voltage domain configurations is avoided with a low leakage buffer with low voltage swing as described herein.

Figure 5:
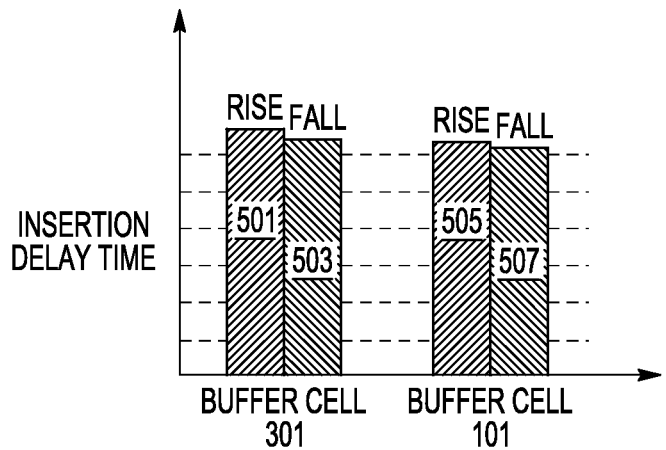
FIG. 5 is a bar chart plotting insertion delay time associated with the buffer cells of FIGS. 1 and 3.

FIG. 5 is a bar chart plotting insertion delay time associated with the non-isolated buffer cell 301 and the corresponding insertion delay time associated with the isolated buffer cell 101. Insertion delay time includes a "rise" delay time to assert the output signal Z from low to high in response to input signal A asserted low to high, and a "fall" delay time to assert the output signal Z from high to low in response to input signal A asserted from high to low. A first bar 501 shows a rise time delay for the buffer cell 301, a second bar 503 shows a fall time delay for the buffer cell 301, a third bar 505 shows a rise time delay for the buffer cell 101, and a fourth bar 507 shows a fall time delay for the buffer cell 101.

Since the rise time delay for the buffer cell 301 (bar 501) is slightly greater than the rise time delay for the buffer cell 101 (bar 505), and since the fall time delay for the buffer cell 301 (bar 503) is slightly greater than the fall time delay for the buffer cell 101 (bar 507), then the insertion delay time for the non-isolated buffer cell 301 is slightly greater than the isolated buffer cell 101. In this manner, there is a slight delay time penalty for the buffer cell 301. The delay penalty, however, is relatively minor and insignificant for most applications. The rise time delay penalty is less than 5%, and the fall time delay is less than 3%. Further, clock distribution uses differences in clock path insertion delay, termed as clock skew. This delay penalty for the buffer cell 301 has negligible penalty on clock skew. In this manner, the insertion delay time penalty of the buffer cell 301 is relatively small.

Figure 6:
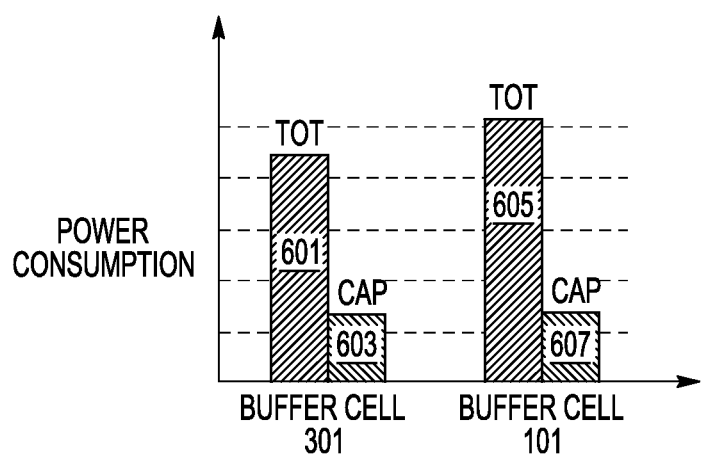
FIG. 6 is a bar chart plotting power consumption associated with the buffer cells of FIGS. 1 and 3.

FIG. 6 is a bar chart plotting power consumption associated with the buffer cell 301 and the corresponding power consumption associated with the buffer cell 101. Power consumption is plotted for both total power consumption and "cap" power consumption for each of the buffer cells 301 and 101. Cap consumption refers to power consumed during switching, and total power includes switching or cap power (power consumed for switching) plus power consumed because of leakage current. A first bar 601 plots the total power of the buffer cell 301, a second bar plots the cap power of the buffer cell 301, a third bar 605 plots the total power of the buffer cell 101, and a fourth bar 607 plots the cap power of the buffer cell 101.

The cap power between the buffer cells 101 and 301 is about the same. The total power of the buffer cell 301 illustrated by bar 601, however, is significantly less than the total power of the buffer cell 101 illustrated by bar 605. In general, the total power of the buffer cell 301 is about 15% less than the total power of the buffer cell 101, primarily due to decreased leakage current. In this manner, a low leakage buffer with low voltage swing as described herein provides significant power savings.

Figure 7:
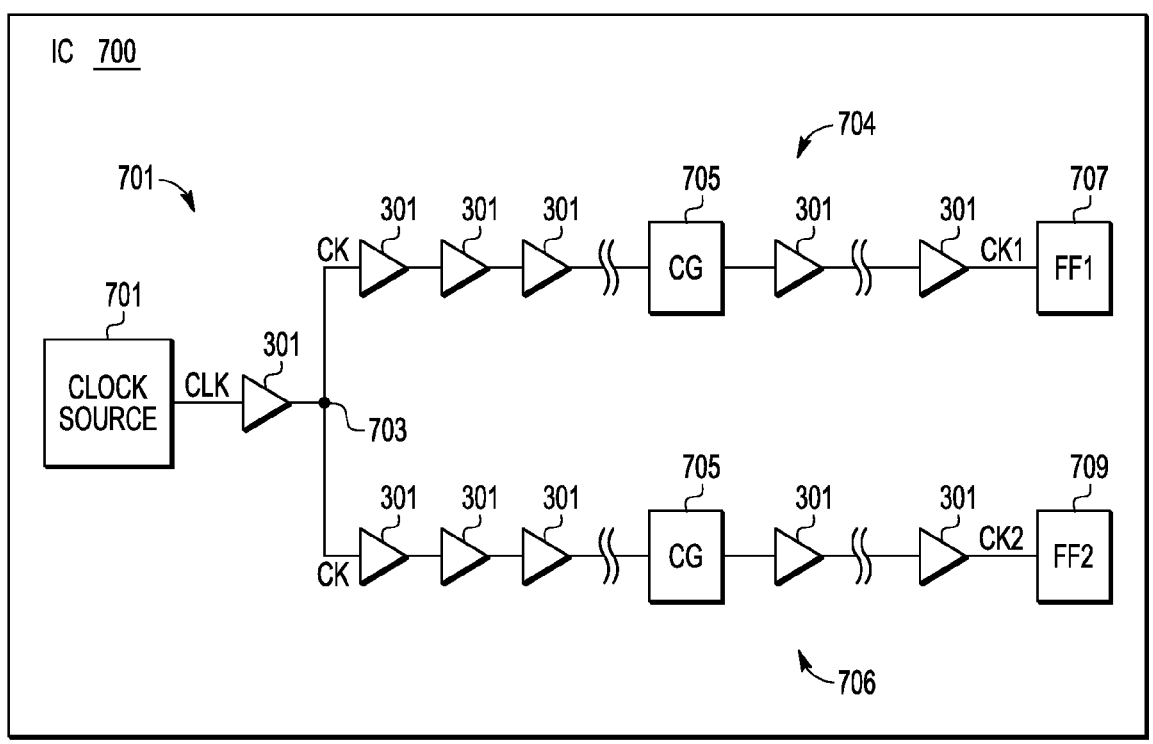
FIG. 7 is a simplified schematic diagram of an IC including a clock tree implemented using the buffer cells of FIG. 3 according to one embodiment.

FIG. 7 is a simplified schematic diagram of an IC 700 including a clock tree 701 implemented using the buffer cells 301 according to one embodiment. A clock source 701 provides a clock signal CLK to an input of a first buffer cell 301, having its output coupled to a clock node 703 developing a buffered block signal CK. Two different clock branches 704 and 706 are shown fanning out from the clock node 703 to distribute the clock signal CK to different destinations of the IC 700. As shown, for example, the clock branch 704 provides a first clock signal CK1 to a first flip-flop 707 and the clock branch 706 provides a second clock signal CK2 to a second flip-flop 709. Each clock branch 704 and 706 includes any number of series-coupled buffer cells 301 between the clock node 703 and the flip-flops 707 and 709. Each clock branch may include other types of devices. As shown, the clock branches 704 and 706 each include a clock gating (CG) cell 705. The CG cell 705 allows clock signals to propagate through the respective clock branch only when needed to further reduce switching power of the clock tree 701. Although not shown, separate enable signals may be provided to each CG cell 705 to turn on and off the propagated clock signal.

The clock branches 704 and 706 are intended to have substantially the same timing delay to synchronize transitions of the clock signals CK1 and CK2 provided to the flip-flops 707 and 709. The difference in the clock delay between multiple destinations, such as the two destinations represented by the clock signals CK1 and CK2 provided to the flip-flops 707 and 709, is referred to as clock "skew." Although the buffer cells 301 have a very small delay penalty as compared to isolated clock buffer cells (e.g., buffer cell 101), the clock skew remains largely unaffected.

It is appreciated that a low leakage buffer cell with low voltage swing as described herein includes PMOS transistors having a current terminal (e.g., source terminal) coupled to a lower voltage rail. The PMOS transistors are implemented in semiconductor wells connected to an upper voltage rail, which is generally the nominal operating voltage level of the IC. Since the semiconductor wells have the same voltage level as the standard cell transistors of the IC, well isolation is not an issue such that the area penalty associated with well isolation is avoided. The lower signal swing by virtue of the lower operating voltage and the reduced current leakage by virtue of the higher well voltage significantly reduce power consumption as compared to standard cells of the IC. The higher well voltage and lower swing causes a slight but relatively insignificant delay penalty. When used for clock distribution, power savings are substantial, the area penalty typically associated with a different voltage domain is avoided, and clock skew remains largely unaffected.

As noted herein, the buffer cell 301 includes a first inverting stage or inverter cell including the PMOS transistor 303 and the NMOS transistor 305 coupled to a second inverting stage or inverter cell including the PMOS transistor 307 and the NMOS transistor 309. Either inverting stage is considered an inverting buffer cell according to one embodiment. Alternatively, another inverting cell may be added in tandem to form a more robust (albeit more complex) inverting buffer cell. A flip-flop cell or a clock gating cell may also be implemented using the principles described herein in which each PMOS transistor has at least one current terminal coupled to a lower supply voltage level and an N-well connection coupled to an upper supply voltage level.

In a more specific configuration, VDD is at least 1V, such as 1.0V or 1.1V, and VDDL is less than 1V, such as 0.8V. The specific voltage levels are arbitrary and depend upon the particular manufacturing technology employed. In general, the upper supply voltage level VDD is sufficiently above the lower supply voltage level VDDL to reduce both switching and leakage current while maintaining substantially the same switching timing.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A CMOS cell incorporated on an integrated circuit, wherein the integrated circuit includes an upper supply voltage rail providing a nominal supply voltage level, a lower supply voltage rail having a lower supply voltage level that is less than the nominal supply voltage level, and a reference supply voltage rail having a reference voltage level that is less than the lower supply voltage level, wherein said CMOS cell comprises:
a first PMOS transistor having a first current terminal coupled to the lower supply voltage rail, having a well connection coupled to the upper supply voltage rail, having a control terminal, and having a second current terminal, wherein said first PMOS transistor is formed on the integrated circuit within an N-well, in which the N-well is conductively tied to the upper supply voltage rail; and
a first NMOS transistor having a first current terminal coupled to said second current terminal of said first PMOS transistor, having a control terminal coupled to said control terminal of said first PMOS transistor, and having a second current terminal coupled to the reference supply voltage rail.

2. The CMOS cell of claim 1, further comprising:
a second PMOS transistor having a first current terminal coupled to the lower supply voltage rail, having a well connection coupled to the upper supply voltage rail, having a control terminal coupled to the second current terminal of said first PMOS transistor, and having a second current terminal; and
a second NMOS transistor having a first current terminal coupled to said second current terminal of said second PMOS transistor, having a control terminal coupled to said control terminal of said second PMOS transistor, and having a second current terminal coupled to the reference supply voltage rail.

3. The CMOS cell of claim 2, wherein said first PMOS transistor and said second PMOS transistor are formed on the integrated circuit within at least one N-well, in which each N-well is conductively tied to the upper supply voltage rail.

4. The CMOS cell of claim 3, wherein said first PMOS transistor is formed on the integrated circuit within a first N-well, and wherein said second PMOS transistor is formed on the integrated circuit within a second N-well which is physically separated from said first N-well on the integrated circuit.

5. The CMOS cell of claim 2, wherein said first NMOS transistor and said second NMOS transistor each have a well connection coupled to the (Original) reference supply voltage rail.

6. The CMOS cell of claim 2, wherein said control terminals of said first PMOS transistor and said first NMOS transistor are coupled together at a cell input, and wherein said second current terminal of said second PMOS transistor and said first current terminal of said second NMOS transistor are coupled together at a cell output.

7. An integrated circuit, comprising:
an upper supply voltage rail developing a nominal supply voltage level, a lower supply voltage rail developing a lower supply voltage level that is less than said nominal supply voltage level, and a reference supply voltage rail having a reference voltage level that is less than said lower supply voltage level;
at least one CMOS cell, comprising:
a first PMOS transistor having a first current terminal coupled to said lower supply voltage rail, having a well connection coupled to said upper supply voltage rail, having a control terminal, and having a second current terminal, wherein said first PMOS transistor is formed within an N-well of said integrated circuit, in which the N-well is conductively tied to said upper supply voltage rail; and
a first NMOS transistor having a first current terminal coupled to said second current terminal of said first PMOS transistor, having a control terminal coupled to said control terminal of said first PMOS transistor, and having a second current terminal coupled to said reference supply voltage rail.

8. The integrated circuit of claim 7, wherein said at least one CMOS cell further comprises:
- a second PMOS transistor having a first current terminal coupled to said lower supply voltage rail, having a well connection coupled to said upper supply voltage rail, having a control terminal coupled to said second current terminal of said first PMOS transistor, and having a second current terminal; and
- a second NMOS transistor having a first current terminal coupled to said second current terminal of said second PMOS transistor, having a control terminal coupled to said control terminal of said second PMOS transistor, and having a second current terminal coupled to said reference supply voltage rail.

9. The integrated circuit of claim 8, wherein said first PMOS transistor and said second PMOS transistor are formed within at least one N-well of said integrated circuit, in which each N-well is conductively tied to said upper supply voltage rail.

10. The integrated circuit of claim 8, wherein said first NMOS transistor and said second NMOS transistor each have a well connection coupled to said reference supply voltage rail.

11. The integrated circuit of claim 7, wherein said reference supply voltage level is zero Volts, wherein said nominal supply voltage level is at least one Volt and wherein said lower supply voltage level is less than 1 Volt.

12. The integrated circuit of claim 7, further comprising at least one clock branch including said at least one CMOS cell.

13. The integrated circuit of claim 12, wherein said at least one CMOS cell comprises a plurality of CMOS cells, and wherein said at least one clock branch includes said plurality of CMOS cells coupled in series.

14. The integrated circuit of claim 13, wherein each of said plurality of CMOS cells further comprises:
- a second PMOS transistor having a first current terminal coupled to said lower supply voltage rail, having a well connection coupled to said upper supply voltage rail, having a control terminal coupled to said second current terminal of said first PMOS transistor, and having a second current terminal; and
- a second NMOS transistor having a first current terminal coupled to said second current terminal of said second PMOS transistor, having a control terminal coupled to said control terminal of said second PMOS transistor, and having a second current terminal coupled to said reference supply voltage rail.

15. A method of reducing power of an integrated circuit, comprising:
- providing an upper supply voltage rail with a nominal supply voltage level;
- providing a lower supply voltage rail developing a lower supply voltage level that is less than said nominal supply voltage level;
- providing a reference supply voltage rail having a reference voltage level that is less than said lower supply voltage level;
- forming a first PMOS transistor within an N-well of the integrated circuit;
- conductively tying the N-well to the upper supply voltage rail;
- coupling at least one CMOS cell to the upper, lower and reference supply voltage rails, comprising:
  - coupling a first current terminal of the first PMOS transistor to the lower supply voltage rail, and coupling a well connection of the first PMOS transistor to the upper supply voltage rail; and
  - coupling a first current terminal of a first NMOS transistor to a second current terminal of the first PMOS transistor, coupling a control terminal of the first NMOS transistor to a control terminal of the first PMOS transistor, and coupling a second current terminal of the first NMOS transistor to the reference supply voltage rail.

16. The method of claim 15, further comprising:
coupling a first current terminal of a second PMOS transistor to the lower supply voltage rail, coupling a well connection of the second PMOS transistor to the upper supply voltage rail, and coupling a control terminal of the second PMOS transistor to the second current terminal of the first PMOS transistor; and
coupling a first current terminal of a second NMOS transistor to a second current terminal of the second PMOS transistor, coupling a control terminal of the second NMOS transistor to the control terminal of the second PMOS transistor, and coupling a second current terminal of the second NMOS transistor to the reference supply voltage rail.

17. The method of claim 16, further comprising:
forming the first and second PMOS transistors within at least one N-well of the integrated circuit; and
conductively tying the at least one N-well to the upper supply voltage rail.

* * * * *